United States Patent [19]

Elwell, Jr.

[11] 4,383,867

[45] May 17, 1983

[54] SOLVENT MIXTURE FOR REMOVING CURED POLYURETHANE COATINGS

[75] Inventor: John L. Elwell, Jr., Hooper, Utah

[73] Assignee: The United States of America as represented by the Secretary of the Air Force, Washington, D.C.

[21] Appl. No.: 279,137

[22] Filed: Jun. 30, 1981

Related U.S. Application Data

[63] Continuation-in-part of Ser. No. 129,437, Mar. 11, 1980, abandoned.

[51] Int. Cl.³ .......................... C08K 5/02; C08K 5/05; C08K 5/20
[52] U.S. Cl. ............................... 106/311; 106/197 C; 134/38

[58] Field of Search .................. 106/311, 316, 197 C; 260/32.6 NR, 33.4 UR, 33.8 UB; 134/38; 252/165, 364

[56] References Cited

U.S. PATENT DOCUMENTS

3,661,641  5/1972  Vigh et al. ............................ 134/38
3,702,304  11/1972  Esposito ............................... 134/38
3,705,857  12/1972  Clarke, Jr. et al. ................... 134/38

Primary Examiner—John Kight, III
Assistant Examiner—Amelia B. Yarbrough
Attorney, Agent, or Firm—Donald J. Singer; William J. O'Brien

[57] ABSTRACT

A solvent solution for dissolving and removing cured polyurethane formulations composed of a mixture of dichloromethane, dimethyl formamide and methanol as essential components.

2 Claims, No Drawings

SOLVENT MIXTURE FOR REMOVING CURED POLYURETHANE COATINGS

STATEMENT OF GOVERNMENT INTEREST

The invention described herein may be manufactured and used by or for the Government for governmental purposes without the payment of any royalty thereon.

CROSS REFERENCE TO RELATED APPLICATION

This application is a continuation-in-part of U.S. patent application Ser. No. 129,437, filed Mar. 11, 1980, now abandoned.

BACKGROUND OF THE INVENTION

This invention relates to a solvent composition. In a more particular aspect, this invention concerns itself with a solvent mixture particularly adapted for use in dissolving and removing cured polyurethane resinous coatings such as paints and foams from metal or plastic substrates.

Polyurethane resins find wide use in a variety of industrial applications. They are a class of polymeric, synthetic resins that can be cured in accordance with well known and conventional curing techniques to produce a variety of products such as rigid, semi-rigid or flexible foams; hard, glossy coatings relatively resistant to solvents; rubbery and fibrous materials; as well as thin, paint-like compositions. Perhaps their most important use in modern technology resides in their application as cured foams in rug backing, upholstery material for furniture, commercial and residential insulation and as insulating materials for aircraft components. The cured polyurethanes also are of importance as conformal coatings and foam encapsulants for electronic circuit boards and other electronic components.

Unfortunately, the solvent resistance of cured polyurethanes presents certain problems. There is great difficulty in removing the hard, protective coatings or encapsulants from electronic components in order to effect repair or replacement of any of the individual units making up the electronic component. Heretofore, it was necessary to grind or severely abrade the cured coatings in order to effect their removal or, alternatively, rely on corrosive solvents which utilized strong acid or basic catalysts as part of the solvent mixture. Often times, the use of grinding techniques or strong solvents resulted in excessive damage to the electronic component and corrosion often occurred resulting in even greater damage. As a result, the repair or replacement of component parts could not be undertaken and the components had to be discarded at a great economic loss.

In order to avoid economic losses, hazardous health conditions from corrosive solvent vapors and health hazards from the pyrolsis of conformal coatings, it was found necessary to develop a solvent mixture that would be effective in dissolving and removing cured polyurethane resins whether in the form of a thick coating, paint-like coating, foam encapsulant or foamed structure. As a result of a research effort generated for the purpose of overcoming the problems previously encountered in removing polyurethane resins, it was found that a solvent mixture containing dichloromethane, dimethyl formamide and methanol could be used to overcome the problems associated with prior methods.

SUMMARY OF THE INVENTION

The present invention concerns itself with a solvent mixture that is especially adapted for dissolving and removing cured polyurethane synthetic resins in the form of coatings, foamed encapsulants, paints and insulation foams. The solvent mixture is effective in removing the polyurethane compounds strictly through solvent activity without the need for an additional abrading or grinding action. A technique which often results in inflicting excessive damage to polyurethane coated, electronic components.

The solvent solution of this invention consists essentially of a mixture of dichloromethane, dimethyl formamide and methanol. The solvent mixture's effectiveness appears to reside in its ability to achieve slight solvation with maximum swelling. This affects the adhesive bond of the cured polyurethane compound thereby facilitating easy removal with little or no damage to the polyurethane coated substrate or electronic component.

Accordingly, the primary object of this invention is to provide a solvent solution that is particularly adapted for dissolving and removing cured polyurethane compounds.

Another object of this invention is to provide a solvent solution that effectively removes cured polyurethane coatings, paints and encapsulated foams through solvent activity alone without resort to the use of anciliary grinding techniques.

Still another object of this invention is to provide a solvent solution for dissolving cured polyurethane coating compounds that does not rely on the use of acid or base catalysts thereby minimizing the problems of corrosion normally associated with previously known polyurethane solvents.

The above and still other objects and advantages of the present invention will become more readily apparent upon consideration of the following detailed disclosure of a preferred embodiment of the invention.

DESCRIPTION OF THE PREFERRED EMBODIMENT

In accordance with this invention, it has been found that the aforementioned objects of this invention can be put into effect by a solvent solution that exhibits slight solvation properties coupled with maximum swelling and degassing properties. The swelling action affects the adhesive bonding of the various types of cured polyurethane products, such as coatings, paints and foams, thereby facilitating easy removal of the polyurethane compound with minimal damage to the substrate or component to which the polyurethane is adhesively bonded.

In order to more clearly describe the present invention and point out with particularity the nature of the solvent solution contemplated thereby, the following example is presented. It should be understood, however, that the example is presented only to illustrate a specific embodiment of the invention and is not intended to limit the invention in any way.

EXAMPLE

| Ingredient | Percent by Volume |
|---|---|
| Dichloromethane (CH$_2$Cl$_2$) | 70 |
| Dimethyl formamide (C$_3$H$_7$NO) | 20 |

| Ingredient | Percent by Volume |
| --- | --- |
| Methanol (CH₃OH) | 10 |

The solution illustrated in the example has been successfully used to remove polyurethane conformal coatings from electronic circuit boards with minimal damage. It has also been employed successfully in the removal of polyurethane encapsulant foams from electronic components and polyurethane insulation foams from aircraft panels. Additionally, it has found utility in the removal of polyurethane paints from aircraft components.

The invention is best put into effect by preparing a suitable amount of the solvent mixture having a compositional content as shown in the example heretofore. The structural component or component part that is coated, painted or encapsulated with a cured polyurethane formulation is then immersed into the solvent mixture. If desired, a cellulose thickener may be added for stripping polyurethane paint from large surfaces. The coated part is then exposed to the action of the solvent for a period of time sufficient to soften the cured polyurethane at which time the part is taken out of the solvent mixture and the polyurethane coating is removed by merely scraping, washing or by subjecting the coating to hydrolytic or gas pressure. The removal time will vary since it is highly dependent upon the particular polyurethane formulation being removed. The cleansed part may be rinsed with methanol or dichloromethane, if desired, in order to allow for more rapid drying.

The utilization of the solvent mixture of this invention eliminates the pyrolysis techniques formerly relied upon in removing conformal coatings in electronic circuit boards. It facilities their repair and maintenance and minimizes the serious health hazards encountered by persons who used previously known removal techniques. It also allows for the repair of foam encapsulated electronic components which were previously discarded because no effective method was available for dealing with the removal of foam encapsulants. In addition, the solvent solution provides for the rapid and effective removal of polyurethane insulation from metal panels, without resorting to the prior art techniques of grinding and severe abrading which often resulted in severe damage to the surface of the metal panels.

While there has been described a particular embodiment of the invention, it should be understood by those skilled in the art to which the subject matter of the present invention pertains that various alterations and modifications may be resorted to without limiting the invention in any way, the scope of which is defined by the appended claims.

What is claimed is:

1. A solvent solution for effectively removing cured polyurethane resinous formulations from a substrate consisting of a mixture of about 70 volume percent dichloromethane, about 20 volume percent dimethyl formamide and about 10 volume percent methanol.

2. A solvent solution in accordance with claim 1 and further including the addition of a cellulose thickener to facilitate the removal of said cured polyurethane resinous formulation from a large surface area substrate.

* * * * *